(12) United States Patent
Bickell et al.

(10) Patent No.: US 11,703,556 B2
(45) Date of Patent: Jul. 18, 2023

(54) SELF-SUPPORTING FLEXIBLE THERMAL RADIATION SHIELD

(71) Applicant: Siemens Healthcare Limited, Camberley (GB)

(72) Inventors: William James Bickell, Eynsham (GB); Simon Chorley, Eynsham (GB)

(73) Assignee: Siemens Healthcare Limited, Camberley (GB)

( * ) Notice: Subject to any disclaimer, the term of this patent is extended or adjusted under 35 U.S.C. 154(b) by 158 days.

(21) Appl. No.: 17/294,744

(22) PCT Filed: Oct. 29, 2019

(86) PCT No.: PCT/EP2019/079516
§ 371 (c)(1),
(2) Date: May 18, 2021

(87) PCT Pub. No.: WO2020/104149
PCT Pub. Date: May 28, 2020

(65) Prior Publication Data
US 2022/0018918 A1    Jan. 20, 2022

(30) Foreign Application Priority Data

Nov. 19, 2018 (GB) ..................... 1818808

(51) Int. Cl.
*G01R 33/38* (2006.01)
*G01R 33/3815* (2006.01)
*H01F 6/04* (2006.01)

(52) U.S. Cl.
CPC ..... *G01R 33/3804* (2013.01); *G01R 33/3815* (2013.01); *H01F 6/04* (2013.01)

(58) Field of Classification Search
CPC ............ G01R 33/3804; G01R 33/3815; G01R 33/3403; H01F 6/04; F17C 13/001
See application file for complete search history.

(56) References Cited

U.S. PATENT DOCUMENTS

| | | |
|---|---|---|
| 3,397,720 A | 8/1968 | Jones |
| 5,651,256 A * | 7/1997 | Herd ................. H01F 6/04 62/51.1 |
| 5,774,032 A | 6/1998 | Herd et al. |
| 6,147,579 A | 11/2000 | Einziger et al. |
| 7,548,000 B2 | 6/2009 | Urbahn et al. |
| 2009/0107151 A1 | 4/2009 | Clayton et al. |

(Continued)

FOREIGN PATENT DOCUMENTS

| | | | |
|---|---|---|---|
| CA | 2697883 A1 * | 10/2010 | ............ B32B 27/12 |
| GB | 1072806 A | 6/1967 | |

(Continued)

OTHER PUBLICATIONS

British Action dated May 10, 2019, Application No. GB1818808.6.
(Continued)

*Primary Examiner* — Daniel R Miller
(74) *Attorney, Agent, or Firm* — Banner & Witcoff Ltd.

(57) ABSTRACT

A self-supporting flexible shield for location between a warm surface and a cold mass so as to substantially enclose the cold mass, wherein the self-supporting flexible shield comprises a shaped plastic sheet with a low emissivity coating on both of its sides.

18 Claims, 4 Drawing Sheets

(56) References Cited

U.S. PATENT DOCUMENTS

| | | |
|---|---|---|
| 2010/0200594 A1 | 8/2010 | Husband et al. |
| 2012/0313642 A1 | 12/2012 | Zia et al. |
| 2014/0159726 A1 | 6/2014 | Ackermann et al. |
| 2016/0172089 A1 | 6/2016 | Calvert et al. |

FOREIGN PATENT DOCUMENTS

| | | |
|---|---|---|
| GB | 2123219 A | 1/1984 |
| GB | 2484079 A | 4/2012 |
| GB | 2490478 A | 11/2012 |

OTHER PUBLICATIONS

PCT—The International Search Report dated Mar. 16, 2020, International Application No. PCT/EP2019/079516.
RUAG Space GmbH, RUAG Catalogue "Thermal Insulation Products", 28 pgs., Nov. 2019.

\* cited by examiner

SELF-SUPPORTING FLEXIBLE THERMAL RADIATION SHIELD

CROSS-REFERENCE TO RELATED APPLICATIONS

The present application is a national stage entry of PCT application no. PCT/EP2019/079516, filed on Oct. 29, 2019, which claims the benefit of the filing date of Great Britain patent application no. GB 1818808.6, filed on Nov. 19, 2018, the contents of each of which are incorporated herein by reference in their entireties.

TECHNICAL FIELD

The present disclosure relates to thermal radiation shields for superconducting magnets, in particular to thermal radiation shields for superconducting magnets for magnetic resonance imaging (MRI) systems.

BACKGROUND

GB2490478 discloses an example of a 4K shield.

U.S. Pat. No. 7,548,000 discloses a power generation system which comprises a thermal radiation shield partly surrounding a superconductive rotor coil, using a thin double-aluminised MYLAR® sheet.

SUMMARY

FIG. 1 shows a conventional arrangement for a superconducting magnet for an MRI system housed within a cryostat including a cryogen vessel 12. A cooled superconducting magnet 10 is provided within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Access turret 19 retains access neck (vent tube) 20 at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 40-100K. A second cooling stage provides cooling of the cryogen gas to a liquid state at a much lower temperature, typically in the region of 4-10K.

The thermal radiation shield 16 acts to prevent thermal radiation from the outer vacuum chamber from reaching the cryogen vessel. In some arrangements, two or more thermal radiation shields may be provided, one inside the other, to prevent or at least impede thermal radiation from a relatively warm surface from reaching a relatively cold surface. In some arrangements, known as "dry" magnets, a cryogen vessel 12 is not provided around the magnet coils 10, and the magnet coils are exposed to the interior surface of a thermal radiation shield 16.

The thermal radiation shield 16 should in itself be thermally conductive, so that cooling of the shield by the cryogenic refrigerator 17 at one point serves to remove heat radiated to all parts of the surface of the thermal radiation shield 16.

The illustrated Outer Vacuum Chamber OVC 14 provides a vacuum volume around the cryogen vessel (if present). The vacuum volume reduces conduction and convection heat loads from the room-temperature enclosure of the OVC 14 to the cryogen vessel 12 or magnet coils 10. The thermal radiation shield 16 serves to reduce the corresponding radiation heat load. The radiation shield 16 is a surface anchored at a temperature intermediate between the temperature of the OVC (about 300K) and the temperature of the magnet coils (e.g. about 4K). The intermediate temperature may be 20K-80K and may be provided by a cryocooler or by boiled-off cryogen gas from the cryogen vessel. In the present description, the thermal radiation shield 16 will be considered to be at a temperature of approximately 50K while the cryogen vessel or magnet structure will be considered to be at a temperature of about 4K.

For reference, the thermal radiation power Q from a large relatively hot surface at temperature $T_h$ to a close, large, relatively cold surface at temperature $T_c$ may be expressed as:

$$Q = \sigma A (T_h^4 - T_c^4)/(1/\varepsilon_1 + (1/\varepsilon_2) - 1)$$

Where:
Q is the thermal radiation power;
$\sigma$ is the Stefan-Boltzmann constant;
A is the surface area of each of the two surfaces in question;
$T_h$ is the temperature of the relatively hot surface;
$T_c$ is the temperature of the relatively cold surface;
$\varepsilon_1$ is the emissivity of the relatively hot surface; and
$\varepsilon_2$ is the emissivity of the relatively cold surface.

Radiation heat-load is therefore proportional to $T_h^4 - T_c^4$, where $T_h$ is the temperature of a relatively hot surface, here the inner surface of the OVC, and $T_c$ is the temperature of a relatively cold surface, here the outer surface of the cryogen vessel, both expressed in Kelvin. By introducing an intermediate temperature $T_i$, the temperature of the thermal radiation shield 16, between the OVC 14 at $T_h$ and the cryogen vessel 12 at $T_c$, the thermal radiation onto the cold surface is reduced by extracting heat energy at a relatively elevated temperature $T_i$.

To reduce the heat-load further, the thermal emissivity of both the emitting (hot) and receiving (cold) surfaces should be reduced as much as possible, whereby the emitting surface gives out minimal radiation the receiving surface absorbs a minimal amount of any radiation that does impinge upon it. Typically, radiation shields 16 are made of aluminium or copper as they have a low emissivity. A thin foil of highly reflective high-purity aluminium may be applied to the surfaces of the thermal radiation shield, to provide low emissivity surfaces.

A multi-layer insulation (MLI) blanket may be placed between the cryogen vessel and the thermal radiation shield; and/or between the OVC and the thermal radiation shield. An MLI blanket comprises several layers of aluminised polyester sheets held in position, spaced slightly apart, shaped and installed to reflect thermal radiation and eliminate line-of-sight paths as far as possible. Such MLI blankets help to reduce thermal radiation between surfaces.

For magnet systems having a cryogen vessel 12 which encloses the magnet coils, the outer surface of the cryogen vessel 12 is a receiving surface for thermal radiation. Typically, this is of stainless steel, which has a high emissivity. Uncleaned alloyed aluminium may alternatively be used, but that also has a relatively high emissivity. A thin foil of highly reflective high-purity aluminium, typically of 50 μm thickness, may be applied to the receiving surface to provide a low emissivity surface which, in this case, tends to reflect incident radiation from the receiving surface.

Disadvantages of this foil-wrapping method include the time taken to effectively wrap the cryogen vessel, as the complexity arising from relatively complex shapes which need to be covered, and the complexity of assembly given that the foil has to be stuck down with double-sided tape and vented with small holes to allow gas to escape when the volume around the cryogen vessel is evacuated within the OVC. The foil will be relatively electrically conductive and in an MRI system, this conductivity may cause gradient coil interaction which may increase system heat-load.

For magnet systems in which the magnet coils 10 are not enclosed within a cryogen vessel (often called "dry magnets"), the magnet coils and supporting structure typically provide the receiving surface. Materials such as stainless steel, GRP, resin such as used in the magnet coils and support assembly, typically have a high emissivity. Some conventional steps have been taken in an attempt to reduce the emissivity. Such surfaces may be coated with a layer of aluminium foil, as discussed above, or with thinner aluminium laminated to plastic such as polyester to give improved resistance to tearing. An example material is COOLCAT 4K by RUAG Space GmbH. It is a laminate of a 6 μm pure aluminium foil and a 12 μm polyester foil, double-side aluminized.

For convenience, the magnet structure within a cryogen vessel (where provided) and the magnet structure alone (where no cryogen vessel is provided) may be referred to as the "cold mass", being the articles which are cooled to the lowest temperature, for example 4K.

Such methods also have disadvantages, including the time taken in wrapping the foil or laminate around complex shapes, in sticking the foil or laminate in place with adhesive tape and providing sufficient holes for gases to escape when the OVC is evacuated. The double-sided adhesive tape which is commonly used only adheres well to metal, and not to plastics, resin or GRP, it may be difficult in arranging the foil or laminate to be adequately attached. The electrical conductivity of a foil means that care must be taken with electrical connectors and around uninsulated wires so as not to compromise electrical isolation. The foil will be relatively electrically conductive and in an MRI system, this conductivity may cause gradient coil inter-action which may increase system heat-load. This may also apply to laminates, depending on the thickness of the metallic layer. If a conductive material layer in the gradient field is very thin then it has high sheet resistance so eddy currents are not induced and there is little dissipation; on the other hand if the conductive material is very thick and conductive, eddy currents are induced but the resistance is low, so there is little ohmic heating and dissipation is again low. If the thickness of the material is in-between then significant eddy currents can be generated and produce resistive losses which increases system heat-load.

An alternative solution which has been proposed is to add a further thermal radiation shield, cooled to essentially the temperature of the cryogen vessel or magnet structure and located between the cryogen vessel or magnet structure and the conventional thermal radiation shield. This further thermal radiation shield may be referred to as a "4K shield" and it may be constructed of aluminium, several millimetres thick, and coated on the outside with low emissivity aluminium foil. The outside surface then absorbs very little radiated heat due to its low emissivity coating, and the inner surface is at essentially the temperature of the cryogen vessel or magnet structure and so does not radiate heat towards the cryogen vessel or magnet structure.

Such structures, however, are costly and heavy due to the quantity of material required. It must be connected to cryogenic cooling means such as refrigerator 17 to keep it at the temperature of the cryogen vessel 12, if any, or magnet structure 10, which adds complexity. The time and energy required to cool the mass of the 4K shield to the required temperature will increase cool-down time on start up. The 4K shield requires space in the bore of magnet coils, which in turn increases their required diameter and so also the amount of wire required, adding cost and weight. The outer surface of the 4K shield needs to be coated with foil, so foil coating is still present as a time-consuming process step. Depending on the thickness and resistivity of the material used for the 4K shield, significant eddy currents can be generated and produce resistive losses which increase system heat-load.

The present disclosure addresses the drawbacks of the conventional arrangement and provides thermal radiation screening which avoids the need for coating surfaces of the cryogen vessel or magnet structure with foil or laminate.

DESCRIPTION OF THE ACCOMPANYING DRAWINGS

The above, and further, objects, characteristics and advantages of the present disclosure will become more apparent from the following description of certain examples of the present disclosure, given by way of example only, in conjunction with the accompanying drawings, wherein:

FIG. 1 schematically shows a conventional arrangement of a wet magnet in a cryostat, showing electrical connections and refrigeration means;

FIG. 2 schematically shows an example arrangement according to one or more embodiments of the present disclosure;

DETAILED DESCRIPTION

Figure 1:
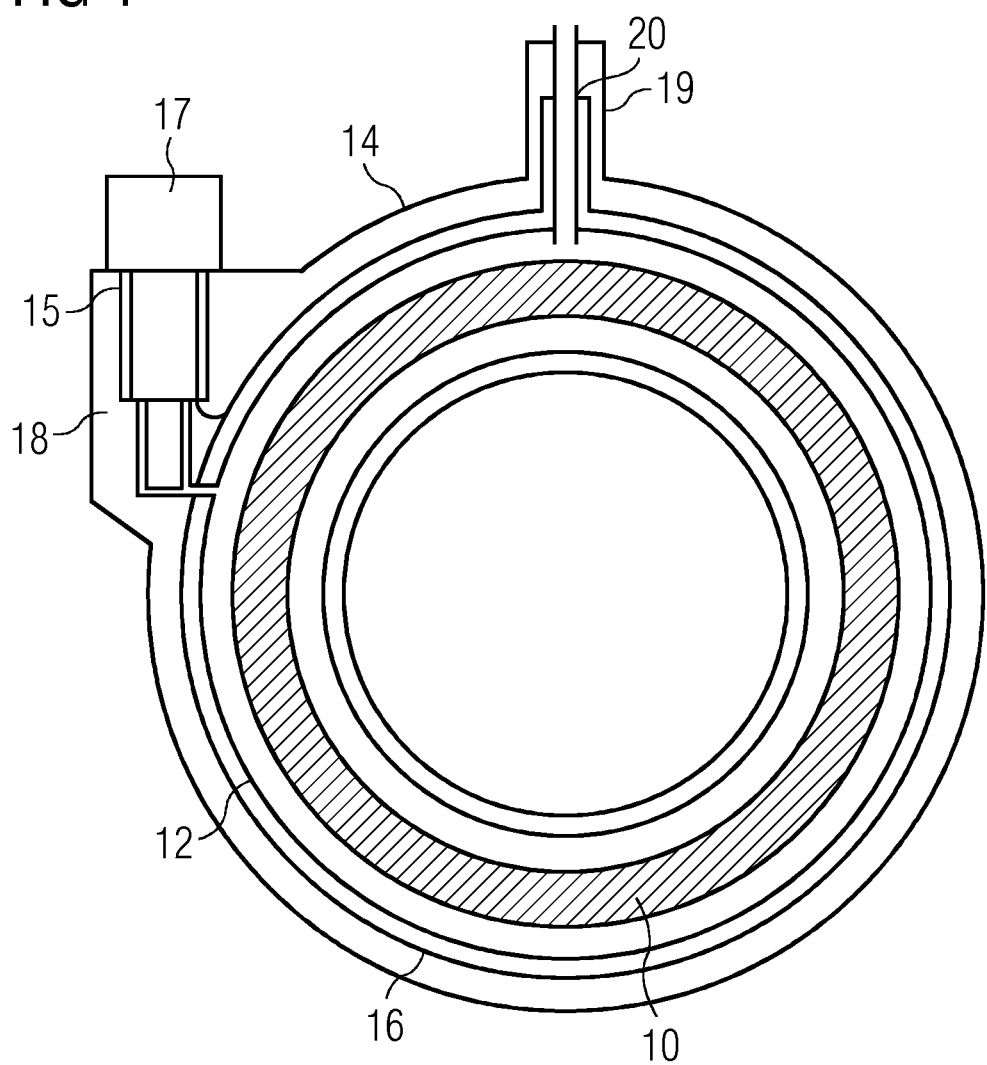
Figure 2:
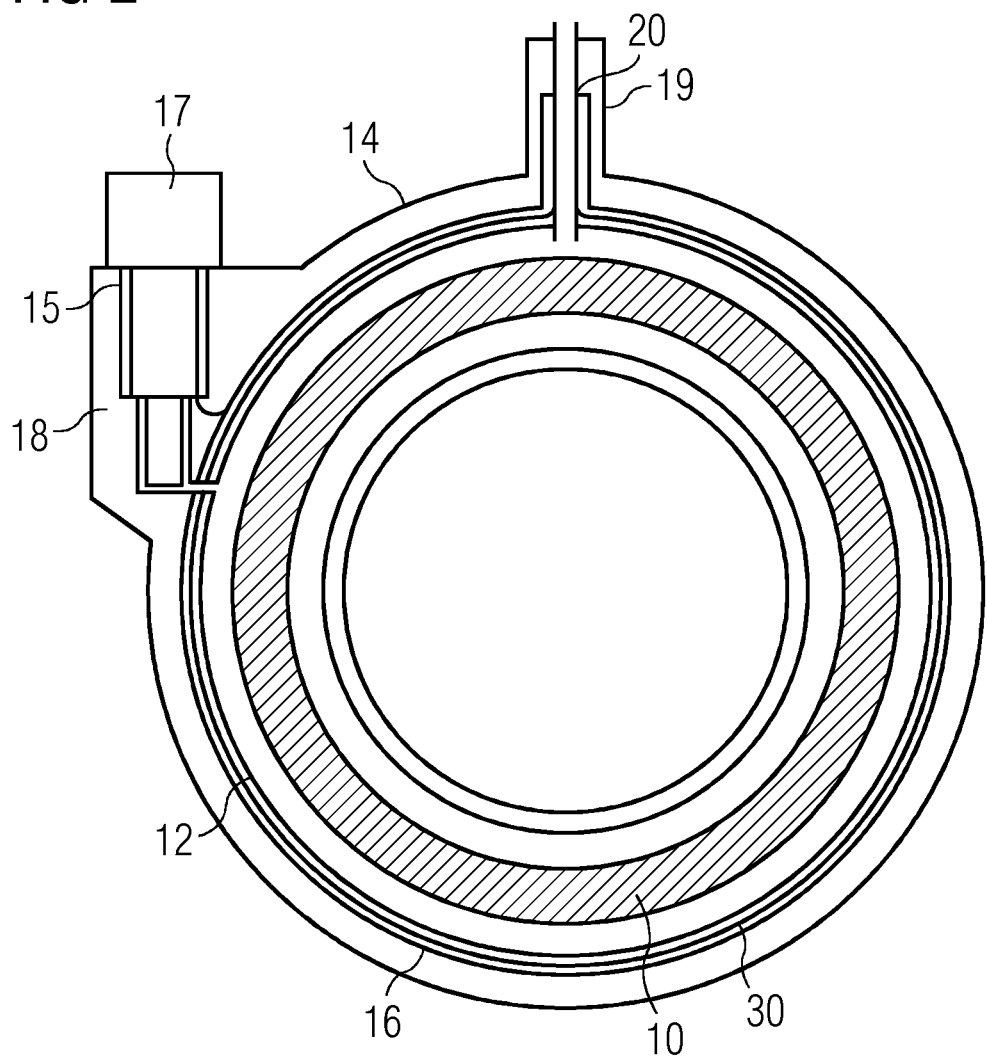

FIG. 2 schematically illustrates an embodiment of the present disclosure, which provides a flexible radiation shield 30 between the cryogen vessel 12 (or the magnet structure 10 when no cryogen vessel 12 is provided) which takes the place of a rigid aluminium 4K shield or the foil or laminate coating described with reference to the prior art. A self-supporting enclosure of low-emissivity flexible material 30, somewhat akin to a tent, is provided, located between the cryogen vessel 12 or magnet structure 10 and the conventional thermal radiation shield 16. It then may be found un-necessary to provide a low emissivity foil coating on the thermal radiation shield or the cryogen vessel or magnet structure. The conventional thermal radiation shield 16 is typically at a temperature of about 50K, and usually between 20K-80K, and the cryogen vessel or magnet structure is typically at a temperature of about 4K. The present disclosure may however be applied between components of different temperature ranges.

The flexible material selected for the self-supporting enclosure is preferably robust enough that it can be folded into self-supporting shapes, and can hold some tension so that its shape can be controlled. For example, suitable materials include double-aluminised polymer sheet, such as polyethylene terephthalate sheet (which may also be known as PET, MYLAR®, polyester film). The PET may have a thickness in the range of 125-500 µm, and the aluminium coating may have a thickness in the range 20-100 nm and may be applied by physical vapour deposition PVD. The thickness of the aluminium coating should be chosen such that it is sufficient to reflect the expected thermal radiation, but not so thick that it has significant in-plane thermal conductivity or is subject to eddy currents produced by gradient-coil interaction.

The flexible material may include, for instance, aluminium coated on both sides to ensure low emissivity properties both toward a higher-temperature surface and toward a lower-temperature surface.

The flexible material may be formed into a self-supporting structure by one or more assembly methods. Examples of such methods include:
  Vacuum forming of heated material, provided that the low emissivity properties of the surfaces is maintained;
  Cutting by laser, knife, saw or other means, then folding into shapes which are held in position by taping or use of slots and barbs formed in the flexible material. Aluminium tape or aluminium-coated polymer tape may be used in assembly of the flexible material, to maintain a low emissivity surface.

Non-adhesive fixings may be used to attach the flexible material to the cryogen vessel or magnet structure. So-called nylon "fir-tree" rivets may be used to hold the flexible material removably in place by passing through corresponding holes in the material of the flexible shield and a support structure. Screws, or other types of rivets may alternatively be used. Slots or holes and barbs may also or alternatively be used.

In certain embodiments, parts of the flexible material may be in close contact with the cryogen vessel or magnet structure and so may be locally cooled to the temperature of that component. In use, such parts will act similarly to the foil or laminate coatings described above. In other locations, the flexible material will be located away from the cryogen vessel 12, if any, or magnet structure 10. The flexible material is intended to have low in-plane thermal and electrical conductivity, so incident radiant heat will not easily flow away in-plane to the magnet structure. Incident radiant heat onto the flexible material of the shield 30 of the present disclosure will cause the temperature of the relevant parts of the flexible material to float up to an intermediate value, between the magnet temperature (e.g. 4K) and the temperature of the conventional thermal radiation shield (e.g. 50K). As the flexible material of the shield of the disclosure has low emissivity on both sides, it reflects most of the radiation emitted by the 50K shield and yet emits very little toward the cryogen vessel or magnet at about 4K. The incident radiation flux onto the cryogen vessel or magnet will be significantly less than in the conventional arrangement with thermal radiation from a 50K shield onto the cryogen vessel or magnet at about 4K.

Using the formula discussed above, if $T_h$=50K, $T_h$=4K, $\varepsilon_1$=0.1, $\varepsilon_2$=0.02, then the thermal radiation onto the cooler surface is of the order of 6 mW/m². This may be the case with a conventional 50K shield of low-emissivity surface enclosing a cryogen vessel covered in a low emissivity layer.

Where a flexible shield as described above is employed, even with a cryogen vessel or magnet with a worst-case emissivity value of 1.00, the flexible shield floats to an intermediate temperature such as about 41K, and the thermal radiation emitted onto the cryogen vessel or magnet is only about 3 mW/m² even under these worst-case conditions.

In certain places, the flexible shield may physically contact components at the temperature of the 50K shield, and so be locally raised to the temperature of the shield. This may happen for example around suspension penetrations. Even if the flexible shield is heated to 50K in such locations, the low in-plane thermal conductivity of the flexible shield means that the remainder of the flexible shield will not heat up to 50K. The effect of the 50K region of the flexible shield of the disclosure is very similar to a region of the 50K shield which is covered with a low-emissivity coating.

In such regions, even with a cryogen vessel or magnet with a worst-case emissivity value of 1.00, and with the flexible shield at a temperature of 50K, the thermal radiation emitted onto the cryogen vessel or magnet is about 7 mW/m² for these regions even under these worst-case conditions.

The low in-plane thermal conductivity of the flexible shield means that regions of the flexible shield may be in contact with the 50K thermal shield, while other regions may be in contact with the cryogen vessel or magnet structure at a temperature of about 4K, without a significant thermal conduction between the regions at such different temperatures. Such low in-plane thermal conductivity is achieved by use of very thin metallic layers to provide the low-emissivity surface without providing appreciable in-plane thermal conductivity.

The material selected for the flexible shield should be of sufficient thickness and therefore resilience that it need not be supported at very regular intervals, and is capable of spanning large gaps without support. It can therefore be mounted from the magnet structure or the mounting structure for the 50K thermal radiation shield at relatively few places. Mounting points may be selected distant from electrical components, meaning that special measures to provide electrical isolation of the flexible shield may be minimized.

In certain embodiments, the inventors have found that 250 µm thick PET sheet, aluminised on both sides to be sufficiently robust to be self-supporting and able to be formed into suitable shapes. Such material is available at a reasonable cost.

The flexible shield as proposed, for example of 250 µm PET, is of low mass, meaning that initial cool-down is kept short.

In regions where the shield is self-supporting, the thermal performance of the flexible shield of the disclosure is found to be superior to conventional application of low-emissivity layer to the cryogen vessel or magnet.

The flexible shield of the present disclosure is quicker to assemble than applying the low-emissivity foil of the conventional arrangement.

The flexible shield of the disclosure requires very little additional radial space. The material of the shield is much less than 0.5 mm thick. It is tolerant of entering into contact with components of higher or lower temperature, as discussed above. It therefore does not need to be located in a continuous annular region and may be fitted around other components of the magnet system as appropriate.

There is no need to provide a cooling path to the shield, as the temperature of the shield is allowed to float and settle at a value between the temperature of the cryogen vessel (e.g. 4K) and the temperature of the thermal radiation shield (e.g. 50K).

The cold mass is substantially enclosed by the flexible shield of the present disclosure.

In addition to, or as part of, the flexible shield 30 located intermediate between the cold mass, comprising cryogen vessel 12 where present or the magnet structure 10, and the thermal radiation shield 16, the material and techniques described above may be used to box-in components to prevent thermal radiation from those components from reaching other components such as the magnet 10 or cryogen vessel 12. For example, a superconducting switch which has to be warmed to change to the open state could be surrounded by a box enclosure made of the material discussed above for the flexible shield, folded into a self-supporting box to block thermal radiation from the superconducting switch on to magnet coils. This prevents thermal radiation from reaching the magnet coils and also reduces heat loss from the switch so that less total heating power needs to be input to open the superconducting switch, which is good for the overall cryogenic system.

The present disclosure provides a self-supporting thermally floating radiation shield. The material chosen is suitably robust to be able to be formed in to shapes and hold its position unaided over relatively large distances. The flexible radiation shield may be of a plastic layer such as 250 μm PET with a low-emissivity coating on both sides. The plastic layer gives the shield sufficient strength and rigidity, while a metal low-emissivity coating, such as 20-100 nm PVD aluminium, provides the required low-emissivity characteristics while keeping a low in-plane thermal and electrical conductivity. This low in-plane thermal conductivity allows the shield to contact both relatively low- and relatively high-temperature surfaces without causing thermal shorts, involving unwanted flow of heat either to or from the flexible shield. Fitting of the flexible shield of the present disclosure reduces complexity and fitting time as compared to applying low-emissivity foil to the surfaces of the cryogen vessel or magnet structure and the thermal radiation shield.

In an embodiment, the flexible shield is formed of a plastic sheet treated by application of a low-emissivity layer on both sides. In particular, the flexible shield may be formed of double-aluminised PET sheet of sufficient thickness to be self-supporting and capable of being formed into self-supporting structures.

Methods for assembling the flexible shield may include the following steps, all allowing production of a lightweight and substantially light-tight shield which is easy to fabricate.

The material of the flexible shield is formed into the required shapes by folding, vacuum-forming, use of barbed tabs and slots to give structural strength to required shapes and allowing the material to enclose complex shapes. The shapes so formed are mounted to a supporting structure by means such as attachment by rivets such as fir-tree rivets, or barbs to require minimum taping, reducing assembly time and reliance on adhesive bonds at low temperatures.

The material of the flexible shield of the disclosure may be cut and folded to form required shapes. Slots, barbs and tabs may be used to enable assembly of the material into required shapes without use of adhesives or fixings. Such cut features may be formed by use of a knife, hot wire cutting, laser cutting, die stamping, and so on. Such components can be assembled cleanly and cheaply, as labor costs may be reduced by the simple assembly procedure. By reducing reliance on adhesives in assembly, the assemblies may be found to be more reliable at low temperatures and the likelihood of an adhesive bond working loose in use is accordingly reduced.

The material of the flexible shield may be used as described to form shields to enclose heated components, to reduce the heat lost by such components by radiation.

Figure 3:
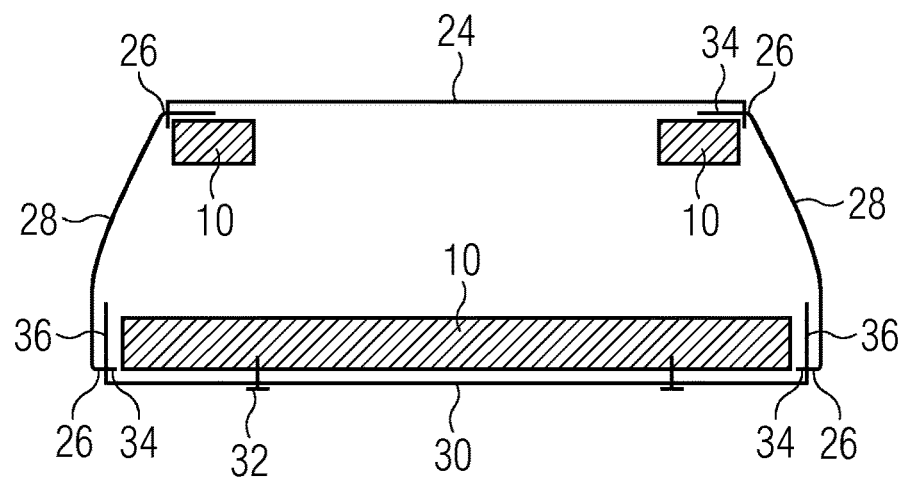
FIG. 3 shows an example flexible shield according to an embodiment of the disclosure in cross-section.

FIG. 3 schematically represents a magnet system, essentially rotationally symmetrical about magnet axis A-A in which the magnet structure is enclosed in a flexible shield according to an embodiment of the present disclosure. The shield shown in FIG. 3 is made by wrapping a sheet of flexible material having two low-emissivity surfaces, such as dual-aluminised PET, around the magnet to form shell piece 24. That shell piece is attached by slot-and-barb fixings 26 to respective end pieces 28, each also formed of a sheet of flexible material having two low-emissivity surfaces, such as dual-aluminised PET. Such slot-and-barb fixings 26 may be repeated at intervals around the circumference of the magnet system. A bore piece 30, also made of a sheet of flexible material having two low-emissivity surfaces, such as dual-aluminised PET, is placed around the inner bore of the magnet, and may be attached to a magnet structure 10, for example a magnet former, using fir-tree rivets 32 or some other suitable fixing means. The bore piece 30 is attached by slot-and-barb fixings 26 to the respective end pieces 28. Such slot-and-barb fixings 26 may be repeated at intervals around the circumference of the magnet system. Alternatively, or in addition, radial extremities 34 of the end pieces 28 may be formed by cutting the radial extremities of the material into flaps, and bending these parallel with the magnet axis. The flaps can then be retained in place by an adhesive tape or, for example, by the above-mentioned interlocking slots and barbed tabs. Alternatively, or in addition, axial extremities 34 of the shell piece 24 and the bore piece 30 may be formed by cutting the axial extremities of the material into flaps, and bending these perpendicular to the magnet axis. The flaps can then be retained in place by an adhesive tape or, for example, by the above-mentioned interlocking slots and barbed tabs.

The end pieces 28, the shell piece 24 and the bore piece 30 may all be attached to magnet coils 10, or a support structure, by fir tree rivets 32 or other suitable fixing.

Figure 4:
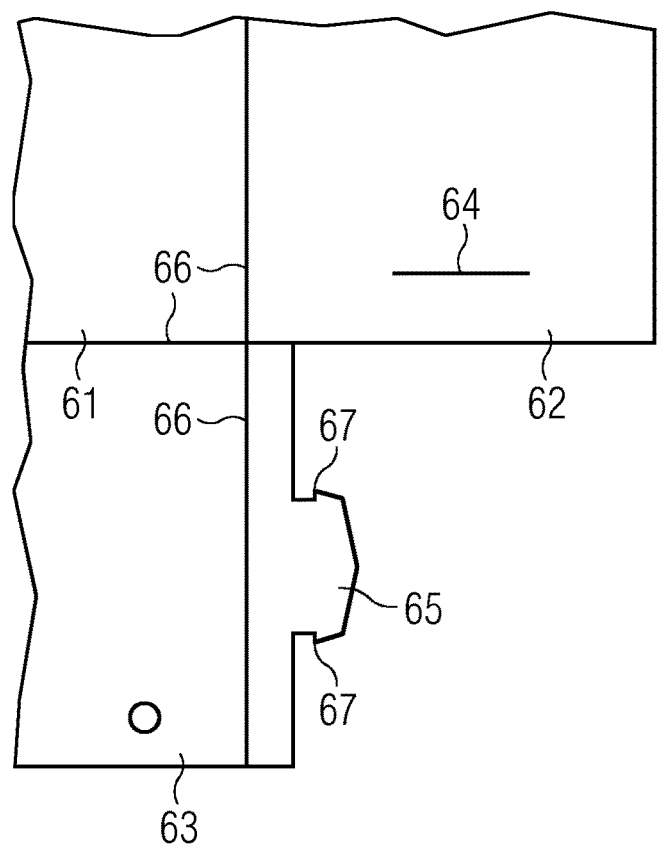
FIG. 4 shows an example partial cutting pattern for flexible material for use in forming part of a flexible shield according to an embodiment of the present disclosure.

FIG. 4 shows an example of a slit and barbed tab arrangement for producing folded structures in the flexible shield material. Material sheet 61 is cut to define flaps 62, 63. One of these flaps, labelled 62, has a slit 64 cut into it. The other flap, labelled 63, has a barbed tab 65 attached to it. During an assembly step, the flexible material is folded along fold lines 66 which may be defined by scoring or partially cutting through the flexible material. Barbed tab 65 is pressed through slit 64 such that barbs 67 engage with ends of slit 64 to retain the assembly together. The structure shown in FIG. 4 may be assembled into a box shape.

Figure 5:
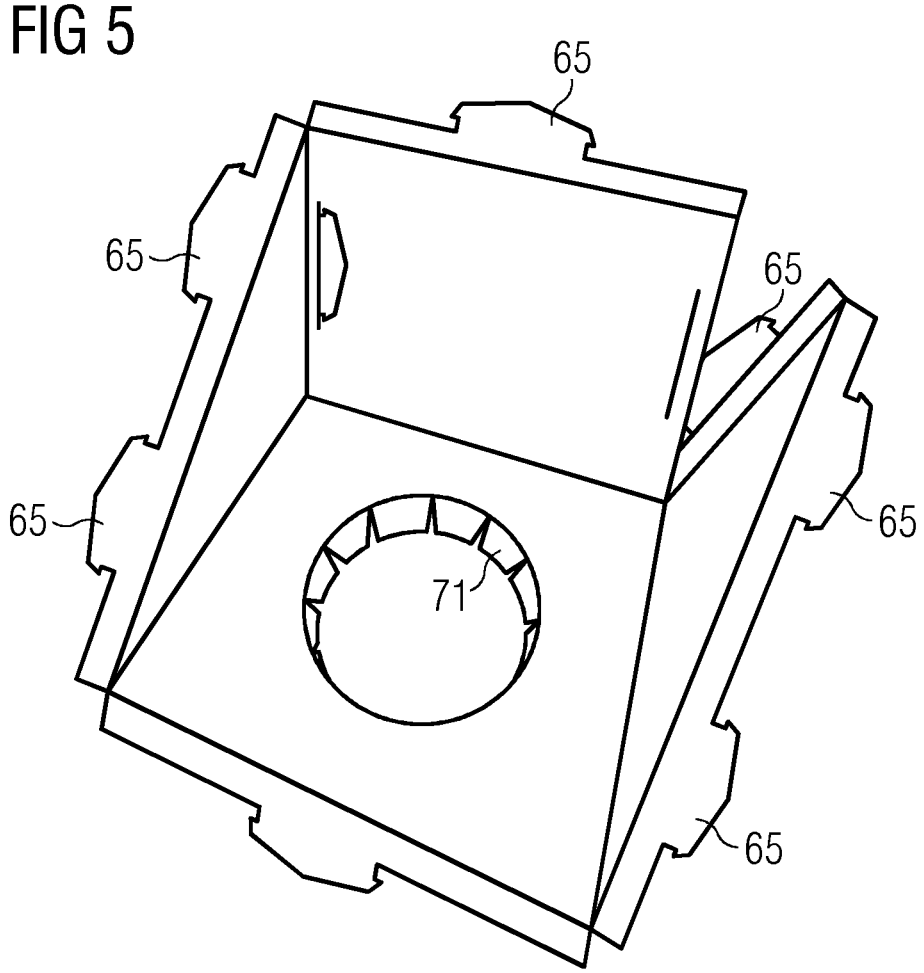
FIG. 5 shows an example folded cowl according to the present disclosure.

FIG. 5 shows a complex folded cowl for placement around a component that must penetrate the shield. In use, it will be in mechanical contact with a part at a temperature of approximately 50K. Barbed tabs 65 and flaps 71 can be seen.

Figure 6:
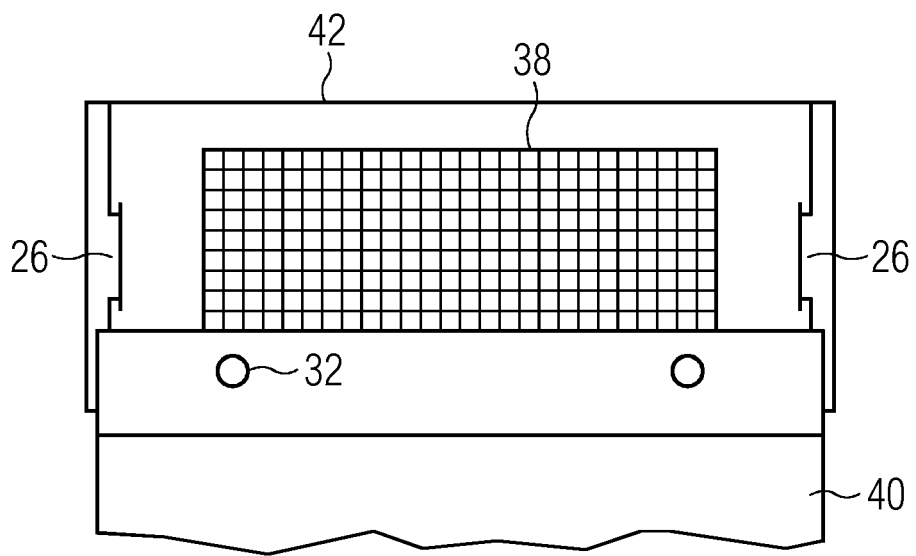
FIG. 6 shows an example folded box according to the present disclosure, used to enclose a heat-generating device such as a switch.

FIG. 6 shows an example of a folded box cover 42 assembled as described with flaps, slits, barbed tabs. Such folded box cover may be used, as illustrated here, to box-in heat-generating components 38 such as a switch, to prevent thermal radiation from those components from reaching other components such as the magnet 10 or cryogen vessel 12. The assembled box 42 is shown attached to a support structure 40 by fir tree rivets 32. In use, this folded box cover is attached to a part which is cooled to a temperature of approximately 4K, which may be the support structure 40. Slot-and-barb fixings 26 are shown, where one side of the box is slightly folded over an adjacent side, to improve the light-tightness of the box.

Although the disclosure has been described with particular reference to superconducting magnets which have an OVC and a thermal radiation shield placed between the OVC the magnet structure or cryogen vessel, if any, it may be applied to other cooled equipment, and so generally the thermal radiation shield of the present disclosure may be located between a warm surface and a cold mass, the term "warm" here being relative and signifying only that it is at a higher temperature than the cold mass. Although described in terms of cryogenically cooled superconducting magnets, the present disclosure may be applied to any cooled equipment within an enclosure which is at a different temperature.

The invention claimed is:

1. A superconducting magnet assembly, comprising:
a cold mass comprising superconducting magnet coils within an outer vacuum chamber with a thermal radiation shield located around the cold mass and inside the outer vacuum chamber; and
a self-supporting flexible shield configured to substantially enclose the cold mass,
wherein the self-supporting flexible shield comprises a shaped plastic sheet having a low emissivity coating on both sides and being located between the cold mass and the thermal radiation shield, the shaped plastic sheet including a folded structure that is attached to the cold mass,
wherein the folded structure comprises a folded box cover.

2. A superconducting magnet assembly according to claim 1, wherein the self-supporting flexible shield thermally floats at a temperature between a temperature of the cold mass and a temperature of the thermal radiation shield.

3. A superconducting magnet assembly according to claim 1, wherein the folded structure comprises a sheet of polymer that is aluminized on both sides.

4. A superconducting magnet assembly according to claim 3, wherein the sheet of polymer comprises a sheet of polyethylene terephthalate (PET) having a thickness between 125-500 µm.

5. A superconducting magnet assembly according to claim 3, wherein the sheet of polymer comprises a sheet of polyethylene terephthalate (PET) having a thickness of 250 µm.

6. A superconducting magnet assembly according to claim 3, wherein the sheet of polymer is aluminized on both sides with respective layers of aluminium, each having a thickness between 20-100 nm.

7. A superconducting magnet assembly, comprising:
a cold mass comprising superconducting magnet coils within an outer vacuum chamber with a thermal radiation shield located around the cold mass and inside the outer vacuum chamber; and
a self-supporting flexible shield configured to substantially enclose the cold mass,
wherein the self-supporting flexible shield comprises a shaped plastic sheet having a low emissivity coating on both sides and being located between the cold mass and the thermal radiation shield, the shaped plastic sheet including a folded structure that is attached to the cold mass, and
wherein the folded structure comprises a folded cowl.

8. A superconducting magnet assembly according to claim 7, wherein the self-supporting flexible shield thermally floats at a temperature between a temperature of the cold mass and a temperature of the thermal radiation shield.

9. A superconducting magnet assembly according to claim 7, wherein the folded structure comprises a sheet of polymer that is aluminized on both sides.

10. A superconducting magnet assembly according to claim 9, wherein the sheet of polymer comprises a sheet of polyethylene terephthalate (PET) having a thickness between 125-500 µm.

11. A superconducting magnet assembly according to claim 9, wherein the sheet of polymer comprises a sheet of polyethylene terephthalate (PET) having a thickness of 250 µm.

12. A superconducting magnet assembly according to claim 9, wherein the sheet of polymer is aluminized on both sides with respective layers of aluminium, each having a thickness between 20-100 nm.

13. A superconducting magnet assembly, comprising:
a cold mass comprising superconducting magnet coils within an outer vacuum chamber with a thermal radiation shield located around the cold mass and inside the outer vacuum chamber; and
a self-supporting flexible shield configured to substantially enclose the cold mass,
wherein the self-supporting flexible shield comprises a shaped plastic sheet having a low emissivity coating on both sides and being located between the cold mass and the thermal radiation shield, the shaped plastic sheet including a folded structure that is attached to the cold mass, and
wherein the folded structure comprises a slit and barbed tab arrangement.

14. A superconducting magnet assembly according to claim 13, wherein the self-supporting flexible shield is thermally floating at a temperature between a temperature of the cold mass and a temperature of the thermal radiation shield.

15. A superconducting magnet assembly according to claim 13, wherein the folded structure comprises a sheet of polymer that is aluminized on both sides.

16. A superconducting magnet assembly according to claim 15, wherein the sheet of polymer comprises a sheet of polyethylene terephthalate (PET) having a thickness between 125-500 µm.

17. A superconducting magnet assembly according to claim 15, wherein the sheet of polymer comprises a sheet of polyethylene terephthalate (PET) having a thickness of 250 µm.

18. A superconducting magnet assembly according to claim 15, wherein the sheet of polymer is aluminized on both sides with respective layers of aluminium, each having a thickness between 20-100 nm.

* * * * *